United States Patent
Toguchi et al.

[11] Patent Number: 5,912,726
[45] Date of Patent: Jun. 15, 1999

[54] PROJECTION EXPOSURE APPARATUS AND METHOD HAVING A POSITIONAL DEVIATION DETECTION SYSTEM THAT EMPLOYS LIGHT FROM AN EXPOSURE ILLUMINATION SYSTEM

[75] Inventors: Manabu Toguchi, Kawagoe; Kei Nara, Yokohama; Masaichi Murakami, Tokyo; Nobutaka Fujimori, Fujisawa; Toshio Matsuura, Tokyo, all of Japan

[73] Assignee: Nikon Corporation, Tokyo, Japan

[21] Appl. No.: 08/922,598

[22] Filed: Sep. 3, 1997

Related U.S. Application Data

[63] Continuation of application No. 08/549,150, Oct. 27, 1995, abandoned.

[30] Foreign Application Priority Data

Oct. 28, 1994 [JP] Japan ..................................... 6-289154

[51] Int. Cl.$^6$ .......................... G03B 27/42; G03B 27/54; G03B 27/32
[52] U.S. Cl. .................................. 355/53; 355/67; 355/77
[58] Field of Search .................................. 356/399, 400, 356/401; 355/53, 67, 77

[56] References Cited

U.S. PATENT DOCUMENTS

| | | | |
|---|---|---|---|
| Re. 33,836 | 3/1992 | Resor, III et al. | 355/43 |
| 4,629,313 | 12/1986 | Tanimoto | 355/53 |
| 5,168,306 | 12/1992 | Morimoto et al. | 355/43 O |
| 5,414,514 | 5/1995 | Smith et al. | 356/401 X |
| 5,602,620 | 2/1997 | Miyazaki et al. | 355/53 |
| 5,617,211 | 4/1997 | Nara et al. | 356/401 O |
| 5,623,343 | 4/1997 | Nara et al. | 356/399 O |

OTHER PUBLICATIONS

Abstract of Japanese Patent Application Laid–Open No. 58–7136.
Abstract of Japanese Patent Application Laid–Open No. 58–7823.

*Primary Examiner*—Richard Moses
*Assistant Examiner*—Shival Virmani
*Attorney, Agent, or Firm*—Vorys, Sater, Seymour and Pease LLP

[57] ABSTRACT

A projection exposure apparatus includes an illumination optical system for illuminating a plurality of partial areas on a mask. A plurality of projection optical systems each project images of the partial areas thus illuminated onto a photosensitive substrate. A mask table holds the mask. A position detector detects a position of the mask table. A substrate table holds the photosensitive substrate. A plurality of first reference marks are provided on the mask table; each of the plurality of first reference marks are disposed at a position corresponding to each of the plurality of projection optical systems. A plurality of second reference marks are provided on the substrate table; the second reference marks are substantially conjugate with the first reference marks with respect to the projection optical systems and are in a predetermined positional relation with the first reference marks in in-plane directions of the mask and the photosensitive substrate. A positional deviation detector detects positional deviations between the first reference marks and second reference marks when light beams from the illumination optical system are radiated onto the plurality of first reference marks to project the plurality of first reference marks through the projection optical systems onto the plurality of second reference marks. A correcting device corrects imaging characteristics of the projection optical systems, based on the positional deviations. The first reference marks can comprise a single aperture of a plurality of apertures. A reverse-type aperture may be employed. The positional deviation detector may include a single photodetector or a plurality of photodetectors.

31 Claims, 8 Drawing Sheets

PROJECTION EXPOSURE APPARATUS AND METHOD HAVING A POSITIONAL DEVIATION DETECTION SYSTEM THAT EMPLOYS LIGHT FROM AN EXPOSURE ILLUMINATION SYSTEM

This is a continuation of application Ser. No. 08/549,150 filed Oct. 27, 1995, now abandoned.

BACKGROUND OF THE INVENTION

1. Field of the Invention

The present invention relates to a projection exposure apparatus and method, which can be applied, for example, to applications of projecting a large-area pattern onto a photosensitive substrate used for fabricating a liquid crystal display board.

2. Related Background Art

Conventional projection type exposure apparatus were arranged to calibrate the imaging characteristic of its projection optical system by printing an image of a mask or the like, in which measurement patterns were written at a plurality of positions preliminarily determined, on a photosensitive substrate. Then the imaging characteristic of the projection optical system was modified (or adjusted) based on an amount of positional deviation from an ideal position, obtained by the measurement of the position of the measurement pattern images formed on the substrate.

Figure 13:
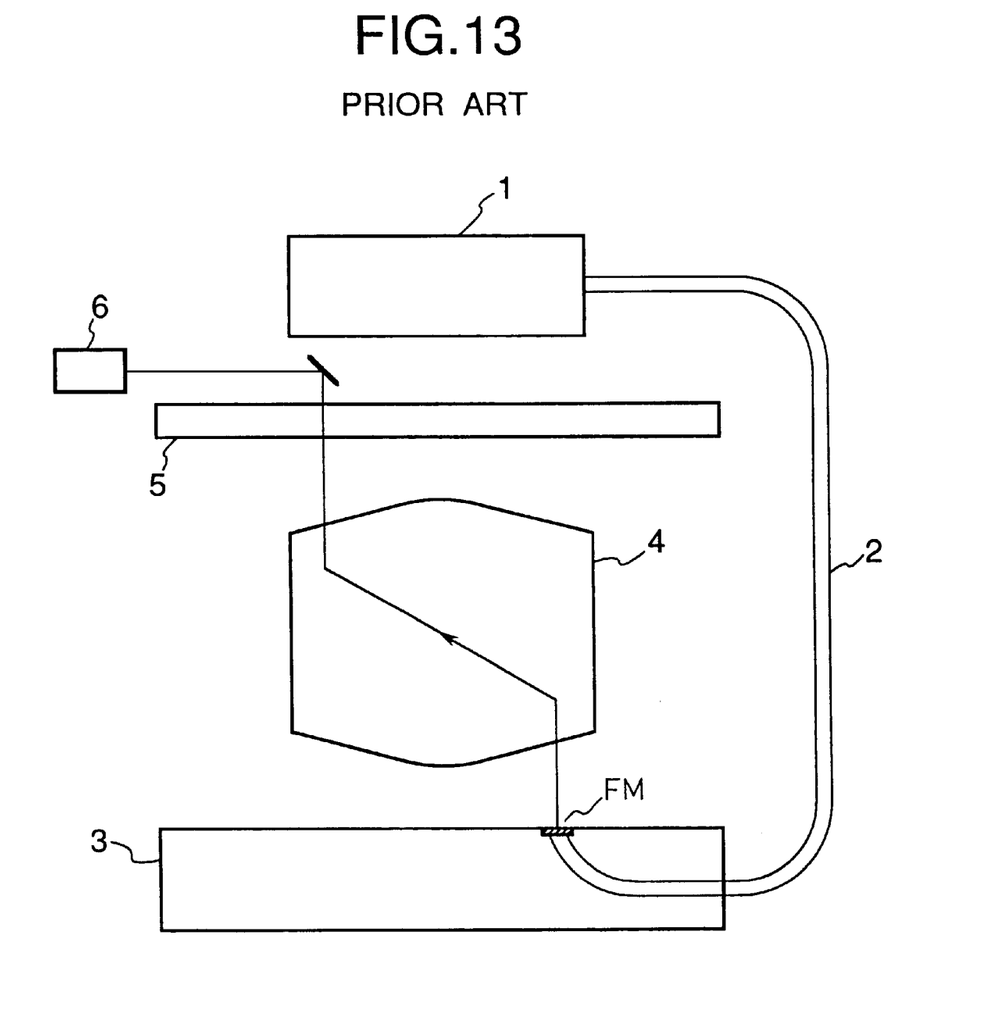
FIG. 13 is a drawing to show the conventional exposure apparatus.

If the apparatus employed a method for measuring the position of pattern through the projection optical system (which is the so-called TTL method) as shown in FIG. 13, a light beam emitted from an illumination light source 1 for exposure was routed through a fiber 2 or the like to a substrate table 3 so as illuminate a fiducial mark plate FM and to conduct the light passing through the plate FM to enter the projection optical system 4. Having passed through the projection optical system 4, the light beam then passed through the measurement pattern portion of mask 5 and entered a photosensor 6. An amount of positional deviation was detected based on the light intensity detected by the photosensor 6 and the position of substrate table 3, and the imaging characteristic of the projection optical system was modified based on the amount of positional deviation.

However, the method of calibrating the imaging characteristic of the projection system 4 by exposure, development, and measurement of the substrate using the test mask or the like, in which the measurement patterns were written, as described above, had problems that the exposure, development, and measurement required a lot of labor and time and were complicated and that measuring equipment for the substrate needed to be taken account of.

On the other hand, the method of calibrating the imaging characteristic by the TTL method had such a drawback that configurations for illumination of and around the substrate table 3 were complicated because of the routing of the illumination light beam for exposure through the fiber 2 etc.

SUMMARY OF THE INVENTION

The present invention has been accomplished in view of the above points, and an object of the invention is to provide a projection exposure apparatus and method capable of readily measuring the imaging characteristic of a projection optical system and correcting it to an optimum condition by a simple configuration.

To achieve the above object, the present invention provides a projection exposure apparatus arranged to illuminate a mask with a light beam from an illumination optical system and to project an image of the mask through a projection optical system onto a photosensitive substrate, which comprises a mask table for holding the mask, disposed at a predetermined position relative to the projection optical system, a substrate table for holding the photosensitive substrate, disposed at a predetermined position relative to the projection optical system, a first reference mark disposed on the mask table, a second reference mark disposed at a position on the substrate table, which is substantially conjugate with the first reference mark with respect to the projection optical system and which is in a positional relation to correspond to the first reference mark in in-plane directions of the mask and photosensitive substrate, a positional deviation detector for detecting a positional deviation between the first reference mark and the second reference mark when the light beam from the illumination optical system illuminates the first reference mark to project an image of the first reference mark through the projection optical system onto the second reference mark, and a correcting mechanism for correcting an imaging characteristic of the projection optical system, based on the positional deviation.

Thus, the projection exposure apparatus is so arranged that the first and second reference marks are located at the predetermined positions in a substantially conjugate positional relation on the mask table and the substrate table and that the light beam from the illumination optical system illuminates the first reference mark to project the image of the first reference mark through the projection optical system onto the second reference mark and then to detect a positional deviation of the image of the first reference mark relative to the second reference mark by the positional deviation detector, whereby the apparatus can readily measure and optimize the imaging characteristic of the projection optical system in the simple configuration, for example, without using of the test mask.

The first and second reference marks are slit (or rectangular) apertures for transmitting the light beam, and the positional deviation detector is a photoelectric detector for detecting a light intensity of the light beam transmitted by the second reference mark formed as slit or rectangular shape. Thus, the positional deviation can be detected by detecting a position of the mask table at a peak of the light intensity of the image formed on the second reference mark.

Further, the projection exposure apparatus is provided with a positioning mechanism for positioning the mask and the photosensitive substrate, based on a detection result by the positional deviation detector. Thus, positioning of the mask and the photosensitive substrate can adjust a deviation component due to a misadjustment only with the projection optical system.

At least two sets of the first and second reference marks are arranged for an image field area of the projection optical system. This permits a deviation of a relative rotational position about the optical axis or center point of the image field area to be corrected in addition to the positional deviations of the projection optical system in the X and Y directions, and-can further improve the accuracy of correction with more sets of the first and second reference marks.

In a preferred embodiment, a plurality of projection optical systems are provided, and images of plural regions of the illuminated mask are independently projected through the respective projection optical systems. This permits the images of the mask projected through the respective projection optical systems to be simultaneously printed as combined or stitched with each other on a large photosensitive substrate, and also permits imaging characteristics of the projection optical systems for projecting the respective images of the mask to be adjusted independently of each other.

DETAILED DESCRIPTION OF THE PREFERRED EMBODIMENTS

Figure 1:
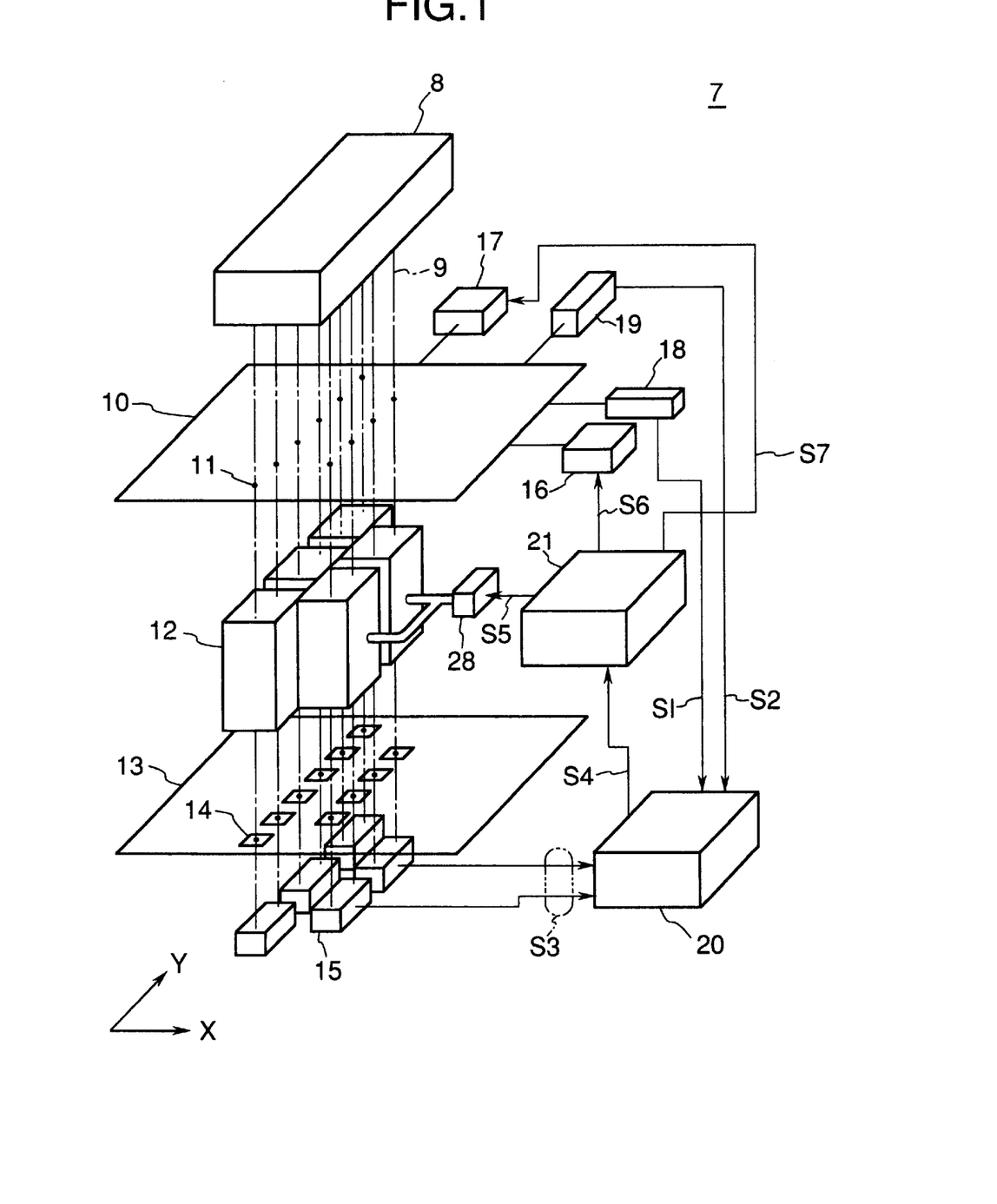
FIG. 1 is a drawing to show a schematic configuration of a projection exposure apparatus according to an embodiment of the present invention.

In FIG. 1, reference numeral 7 designates a projection exposure apparatus as a whole, which is arranged to project a pattern on the mask larger than the image field of projection optical system onto a large photosensitive substrate used for fabricating a liquid crystal display board. Light beams 9 from illumination optical system 8 are radiated onto the mask (not shown). An image of the mask thus illuminated is projected through a plurality of respective projection optical systems 12 (for example, five projection optical systems) onto the photosensitive substrate (not shown). The projection optical systems 12 are arranged along the Y direction in the drawing and each two adjacent optical systems are displaced in the X direction. Thus, the images projected onto the photosensitive substrate are also arranged in an array corresponding to the array of the projection optical systems. The entire surface of the mask is projected onto the photosensitive substrate by synchronously scanning the mask and the photosensitive substrate relative to the projection optical systems 12. On the other hand, the plurality of light beams 9 emitted from the illumination optical system 8 for exposure are radiated onto a plurality of slit marks 11 arranged at predetermined positions on the mask table 10 for holding the mask with a pattern formed thereon.

Figure 2:
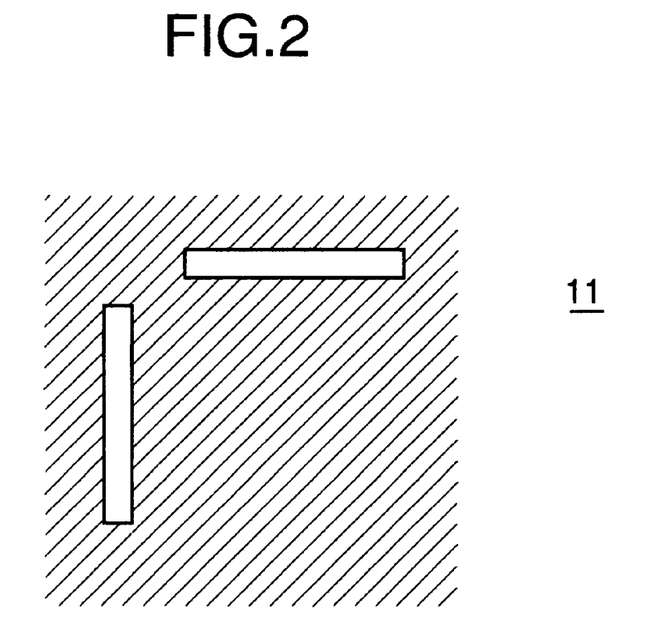
FIG. 2 is a plan view to show a shape of a slit mark on the mask table.
Figure 3:
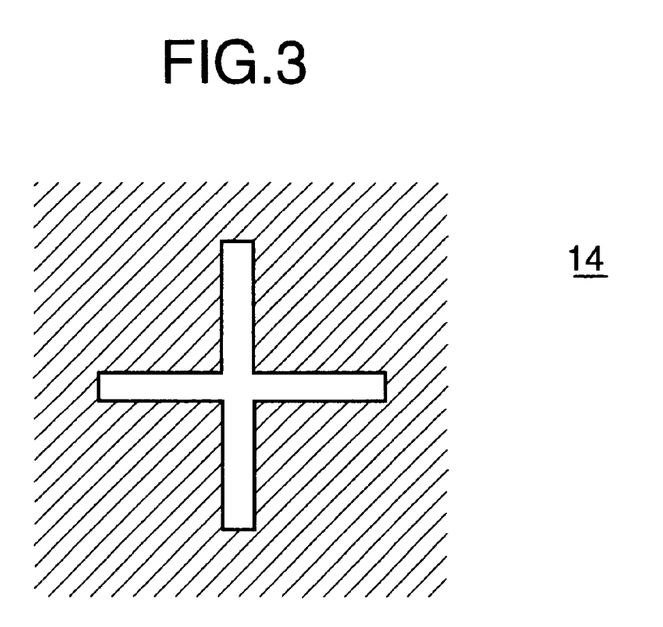
FIG. 3 is a plan view to show a shape of a slit mark on the substrate table.

As shown in FIG. 2, the slit marks 11 each are optically transparent apertures formed in a slit pattern in a chromium layer vapor-deposited on a transparent member such as glass. As shown in FIG. 1, the plurality of light beams 9 passing through the plurality of slit marks 11 are each incident into the five projection optical systems 120. When aberrations including distortion are eliminated from the projection optical systems 12, the light beams 9 are projected through the projection optical systems 12 onto a plurality of slit marks 14 arranged at predetermined positions on the substrate table 13 for holding the photosensitive substrate. As shown in FIG. 3, the slit marks 14 are slit apertures in a cross shape corresponding to a slit mark 11. As shown in FIG. 1, the light beams passing through the slit marks 14 are incident to photosensors 15 disposed immediately below the slit marks 14 in the substrate table 13, and are photoelectrically converted by photoelectric conversion elements (15a in FIG. 4) in the photosensors 15.

This exposure apparatus is provided with drive systems 16, 17 for driving the mask table 10 in the X and Y directions as shown in FIG. 1. Further, the apparatus is provided with position detecting devices 18, 19, for example each consisting of an interferometer etc., for detecting an amount of movement of the mask table 10.

Signals S1, S2 output from the position detecting devices 18, 19 and signals S3 output from the photosensors 15 are put into a signal processing unit 20. The signal processing unit 20 processes these signals S1–S3 to calculate positional deviations or a relative positional relationship between slit marks 11, 14. A signal S4 representing the positional deviations or the positional relationship, output from the signal processing unit 20, is put into a control unit 21. The control unit 21 sends a control signal S5 based on the signal S4 concerning the positional information to an adjusting mechanism 28 to adjust the imaging characteristics of the projection optical systems by driving optical elements (plane-parallel glass, lens or mirror) in the respective projection optical systems 12 or changing the pressure of space between optical elements therein to finely adjust an index number of gas filled in the space.

Figure 4:
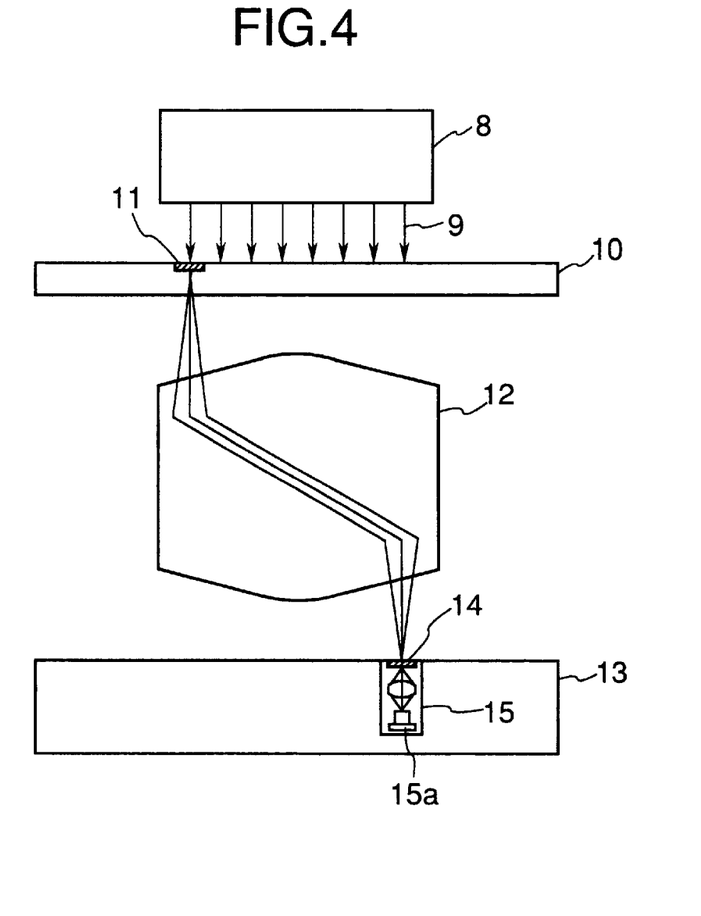
FIG. 4 is a sectional view to show an arrangement in which the slit mark on the mask table and the slit mark on the substrate table are located in a substantially conjugate positional relation.

As shown in FIG. 4, the slit marks 11, 14 are arranged in a paired relation (or in a positional relation to be opposed to each other in the XY plane) and are located at conjugate positions through the projection optical systems 12. The slit marks 11 are formed so that the height thereof is coincident with the position of the pattern surface of the mask. Also, the slit marks 14 are formed so that the height thereof is coincident with the position of the surface of the photosensitive substrate.

In the above configuration, in order to optimize the imaging characteristics of the projection optical systems 12 (to change the shapes of their images to those extremely close to designed values or to minimize a deviation between two adjacent images in the case of a plurality of projection optical systems being provided), two or more sets of the slit marks 11, 14 per projection optical system 12 are arranged on the mask side and on the photosensitive substrate side so as to permit two or more positional deviation amounts or data of a relative positional relationship to be detected for each of the plurality of projection optical systems 12, and the characteristics of projection optical systems 12 are measured in the following procedures.

Figure 5:
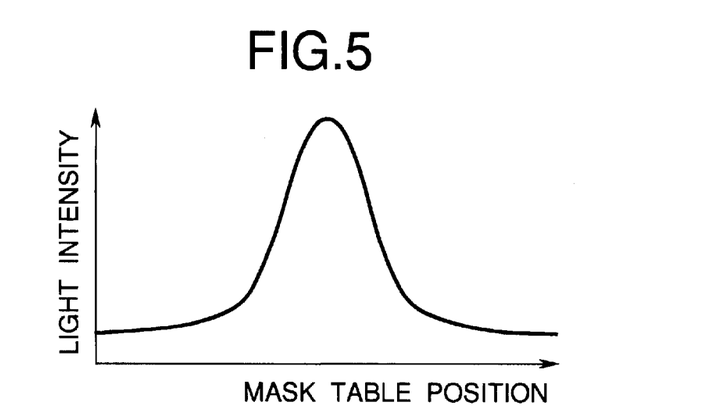
FIG. 5 is a drawing to show characteristics of intensity of light received by the photosensor when the slit marks of FIG. 3 and FIG. 4 are used.
Figure 6:
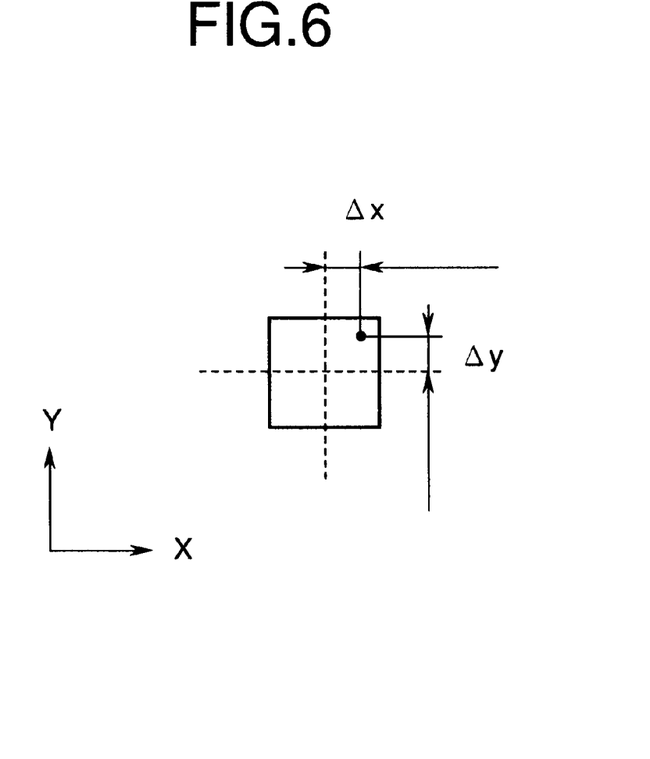
FIG. 6 is a drawing to show deviation amounts when a light beam passing through the slit mark on the mask table is projected onto the slit mark on the substrate table.

In detail, the slit marks 11 are projected through the projection optical systems 12 onto the slit marks 14. On this occasion the mask table 10 can be moved in the X and Y directions. Next, each slit mark 14 is scanned by an image of a slit mark 11. This gives the signal processing unit 20 positional information obtained from the position detecting devices 18, 19 and light intensities detected by the photosensors 15, and the signal processing unit 20 obtains a characteristic curve for each pair, in which the light intensity forms a peak in a mountain shape when X- and Y-directional positions of the slit marks 11, 14 come to coincide with respect to the position of mask table 10, as shown in FIG. 5. The signal processing unit 20 calculates a positional deviation amount between each pair of slit marks 11, 14 through the projection optical system 12, based on this characteristic curve. FIG. 6 shows a case in which the X- and Y-directional positions of the slit marks 11, 14 are displaced by respective deviations of ΔX, ΔY with respect to the position of mask table 10.

The signal processing unit 20 detects positional deviation amounts at two or more points per projection optical system 12. The control unit 21 calculates correction data necessary for correcting the imaging characteristic of each projection optical system 12, based on the positional deviation amounts at the two or more points. After the control unit 21 calculates correction data necessary for correcting the imaging characteristics of the respective projection optical systems 12, as described, it corrects the imaging characteristics of the respective projection optical systems 12 through the adjusting mechanism 28.

This optimizes the imaging characteristic of each of the plural projection optical systems 12, which permits projection images by the plurality of projection optical systems 12 to be continuously and uniformly (without deviation of images due to a difference of imaging characteristics between images by adjacent projection optical systems) projected onto the photosensitive substrate.

According to the above configuration, the slit marks 11 and 14 are arranged at the predetermined positions as keeping a substantially conjugate positional relation on the mask table 10 and the substrate table 13, the light beams 9 from the illumination optical system 8 illuminate the slit marks 11, and the photodetectors detect positional deviations of the images of slit marks 11 projected through the respective projection optical systems 12 on the slit marks 14, relative to the slit marks 14, whereby the imaging characteristics of projection optical systems 12 can be corrected into an optimum state in an easy fashion and by the simple configuration.

Figure 7:
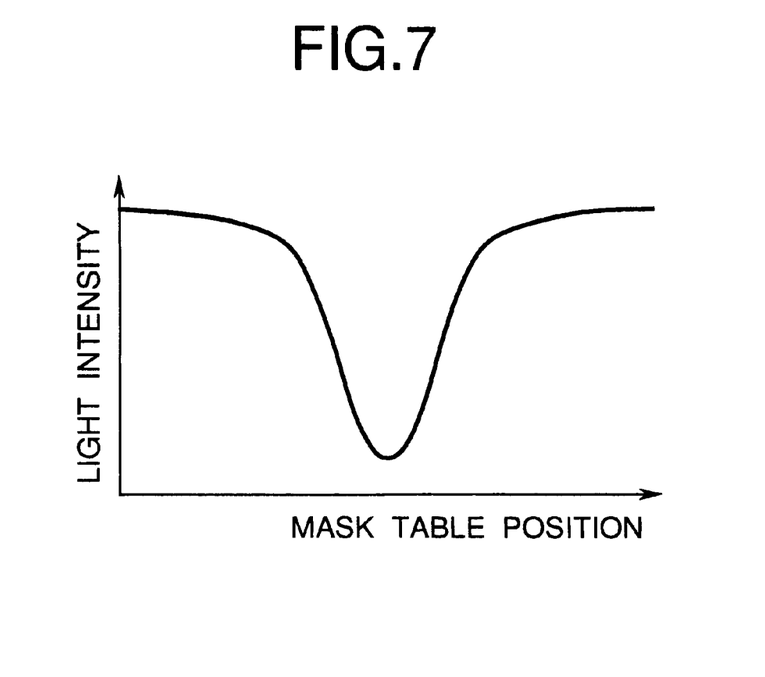
FIG. 7 is a drawing to show characteristics of light intensity when another reverse slit mark according to another embodiment is used on the mask table.

The above embodiment illustrated an example in which the slit marks 11 were rectangular slit apertures transmitting the light beams 9, but the present invention is by no means limited to this example and may be applied to applications with reverse slit marks on the mask side, in which the optically transparent portions and the chromium layer are reversed. This arrangement can also achieve the same effects as described above. In this case, a characteristic curve is obtained as shown in FIG. 7, in which the light intensity forms a bottom in a valley shape when the positions of the slit marks 11 and 14 come to coincide with respect to the position of mask table 10. An amount of positional deviation can be calculated based on the position of the bottom.

Figure 8:
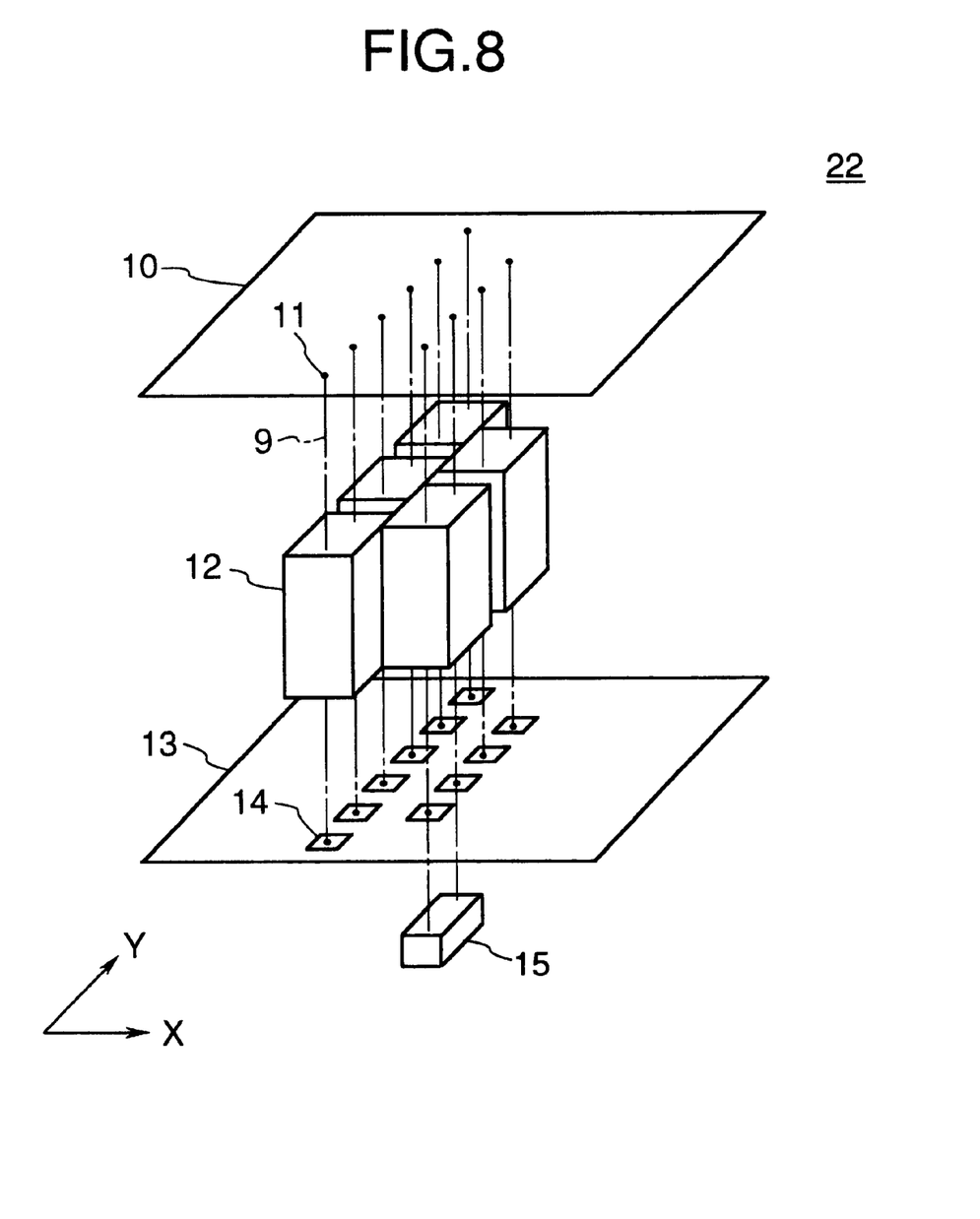
FIG. 8 is a drawing to show a schematic configuration of a projection exposure apparatus according to another embodiment.

Further, the above embodiment showed the example in which a photosensor 15 was provided per set of slit marks 11, 14, but, without having to be limited to the example, the present invention can be applied to cases in which a photosensor 15 is arranged to be common to plural sets of slit marks 11, 14, as exemplified by a projection exposure apparatus 22 shown in FIG. 8. In this case, the photosensor 15 is relatively moved in order to check positional information of the plural sets of slit marks 11, 14.

Further, the above embodiment included the five projection optical systems 12, but, without having to be limited to this, the present invention can be applied to cases including an arbitrary number of projection optical systems.

Figure 9:
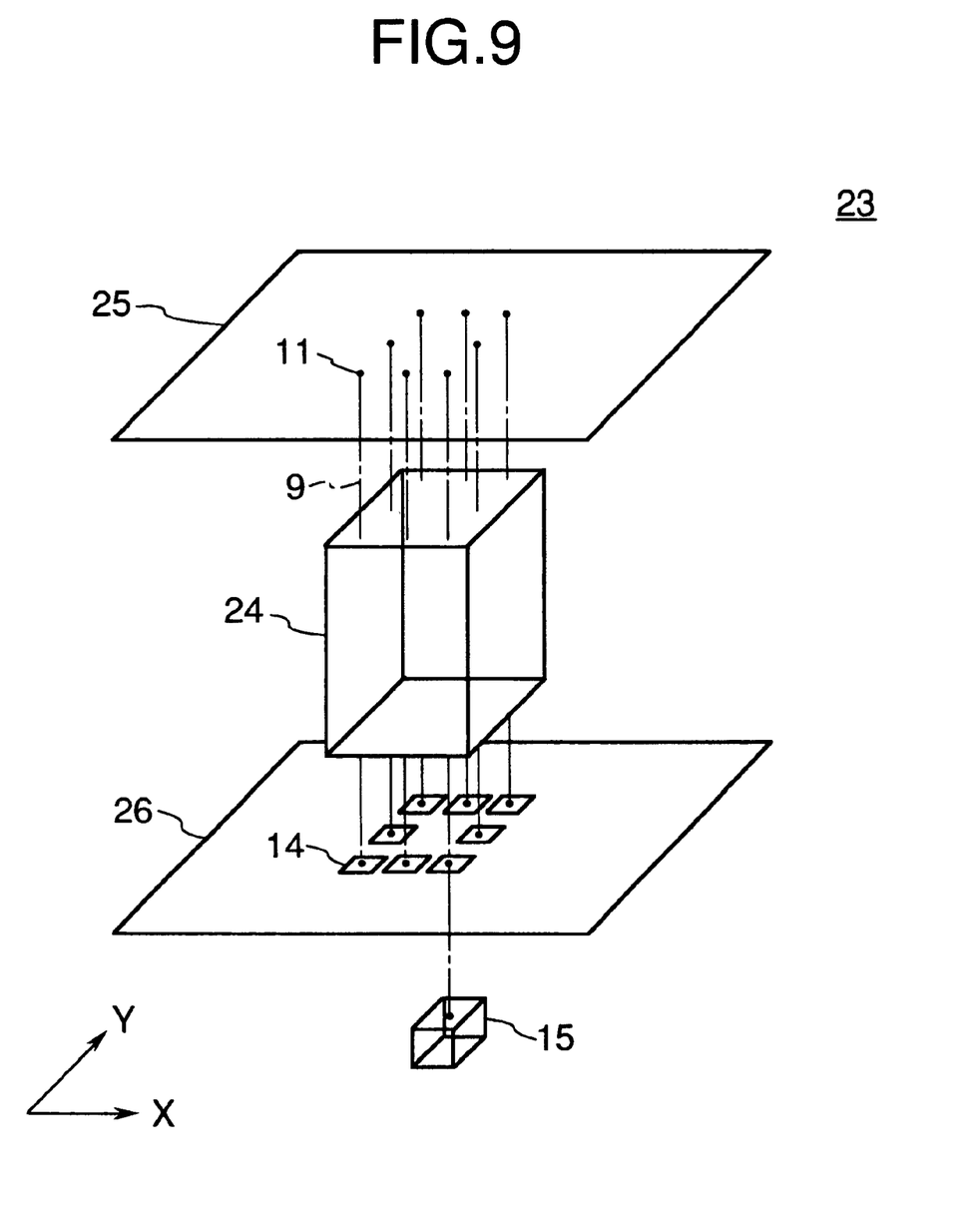
FIG. 9 is a drawing to show a schematic configuration of a projection exposure apparatus according to still another embodiment.

For example, a projection exposure apparatus 23 as shown in FIG. 9, is provided with only one projection optical system 24. The mask table 25 and substrate table 26 have the respective slit marks 11, 14 arranged in a same number of sets as a number of plural light beams 9 incident to the projection optical system 24.

Further, the above embodiment showed the example in which the plurality of paired slit marks were provided and positional deviations were detected by scanning the slit marks 14 on the photosensitive substrate side by the slit images of the mask-side slit marks 11, but, without having to be limited to this example, the present invention can also be applied to cases in which the substrate table 13 is provided with an XY table arranged to move greatly in the X and Y directions and position detecting devices and in which only a slit mark 14 and photosensor 15 are provided on the substrate table side. In this case, the substrate table 13 is moved to a predetermined detection position by driving the XY table on the substrate table side, and thereafter the slit mark 14 is scanned by a short distance by a slit image of a mask-side slit mark 11 to detect an amount of positional deviation.

Figure 10:
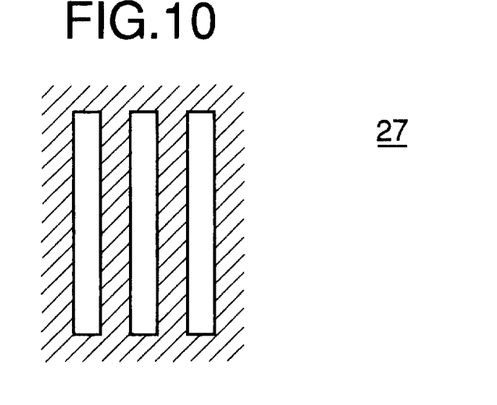
FIG. 10 is a drawing to show a slit mark on the mask table according to another embodiment.
Figure 11:
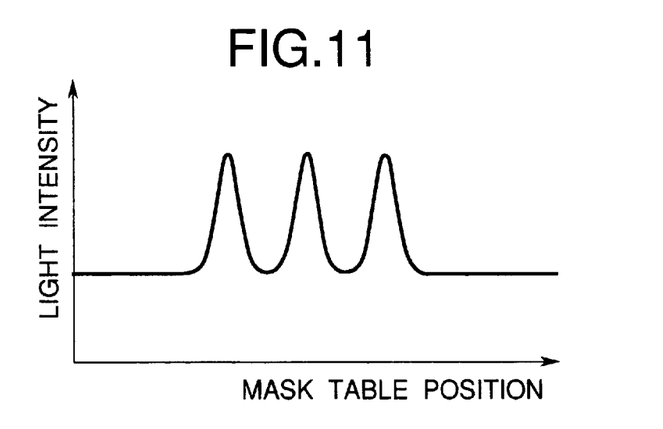
FIG. 11 is a drawing to show characteristics of light intensity when the slit mark according to the another embodiment is used on the mask table.
Figure 12:
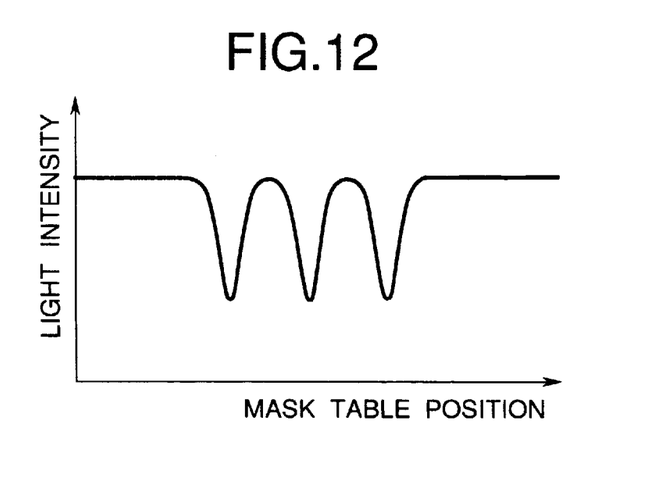
FIG. 12 is a drawing to show characteristics of light intensity when another slit mark according to still another embodiment is used on the mask table.

Further, the above embodiment showed the example in which each slit mark 11 in the mask table 10 was a rectangular slit, but, without having to be limited to this example, the present invention can also be applied to cases in which a slit mark 27 on the mask table side is composed of a plurality of (three herein) rectangular slits, as shown in FIG. 10, in place of the slit mark 11. In this case, depending upon whether the slits are apertures or not, a characteristic curve is obtained as shown in FIG. 11 in which the light intensity distribution shows three peaks in a mountain shape or a characteristic curve is obtained as shown in FIG. 12 in which the light intensity distribution shows three bottoms in a valley shape, which permits us to expect an averaging effect by the number of slits.

Further, the above embodiment showed the example in which the present invention was applied to the exposure apparatus 7 for exposing the photosensitive substrate used for fabricating a liquid crystal display, but, without having to be limited to this example, the present invention can also be applied widely to exposure apparatus for exposing any objects to be exposed, for example to exposure apparatus for exposing a photosensitive substrate used for fabricating a plasma display, etc.

What is claimed is:

1. A projection exposure apparatus comprising:

an illumination optical system for illuminating a plurality of partial areas on a mask;

a plurality of projection optical systems each for projecting images of said partial areas thus illuminated onto a photosensitive substrate;

a mask table for holding said mask;

a position detector for detecting a position of said mask table;

a substrate table for holding said photosensitive substrate;

a plurality of first reference marks provided on said mask table, each of said plurality of first reference marks being disposed at a position corresponding to each of said plurality of projection optical systems;

a plurality of second reference marks provided on said substrate table, said second reference marks being substantially conjugate with said first reference marks with respect to said projection optical systems and being in a predetermined positional relation with said first reference marks in in-plane directions of said mask and said photosensitive substrate;

a positional deviation detector for detecting positional deviations between said first reference marks and second reference marks when light beams from said illumination optical system are radiated onto said plurality of first reference marks to project said plurality of first reference marks through said projection optical systems onto said plurality of second reference marks; and correcting means for correcting imaging characteristics of said projection optical systems, based on said positional deviations.

2. A projection exposure apparatus according to claim 1, wherein said first and second reference marks are slit apertures that transmit said light beams and said positional deviation detector is a photoelectric detector for detecting a light intensity of a light beam transmitted by said second reference mark.

3. A projection exposure apparatus according to claim 1, further comprising a positioning mechanism for positioning said mask and said photosensitive substrate, based on a result of detection by said positional deviation detector.

4. A projection exposure apparatus according to claim 1, wherein said first and second reference marks comprise at least two each provided for each of said plurality of projection optical systems.

5. A projection exposure apparatus according to claim 1, wherein said plurality of projection optical systems are arranged along a first direction and each two adjacent said projection optical systems are arranged as displaced from each other in a second direction perpendicular to said first direction.

6. A projection exposure apparatus according to claim 1, wherein the projection exposure apparatus is a scanning-type projection exposure apparatus which effects scanning movement of the mask and the photosensitive substrate relative to the projection optical systems.

7. A projection exposure apparatus comprising:

an illumination optical system for illuminating a plurality of partial areas on a mask;

a plurality of projection optical systems each for projecting images of said partial areas thus illuminated onto a photosensitive substrate;

a mask table for holding said mask;

a position detector for detecting a position of said mask table;

a substrate table for holding said photosensitive substrate;

a plurality of first reference marks provided on said mask table, each of said plurality of first reference marks being disposed at a position corresponding to each of said plurality of projection optical systems;

a second reference mark provided on said substrate table, said second reference mark being disposed in a plane substantially conjugate with a plane on which said first reference marks exist, with respect to said projection optical systems;

a positional deviation detector for detecting positional deviations between said first reference marks and second reference mark when light beams from said illumination optical system are radiated onto said plurality of first reference marks to successively project said plurality of first reference marks through said projection optical systems onto said second reference mark; and correcting means for correcting imaging characteristics of said projection optical systems, based on said positional deviations.

8. A projection exposure apparatus according to claim 7, wherein the projection exposure apparatus is a scanning-type projection exposure apparatus which effects scanning movement of the mask and the photosensitive substrate relative to the projection optical systems.

9. A projection exposure apparatus which exposes a pattern of a mask on a substrate, comprising:

a plurality of projection optical systems which are disposed between said mask and said substrate, and which project an image of said pattern of said mask on said substrate;

a mask table which has a plurality of first reference marks corresponding to said plurality of projection optical systems, and which holds said mask;

a substrate table which has a plurality of second reference marks corresponding to said plurality of first reference marks, and which holds said substrate;

a positional deviation detector which detects positional deviations between said first reference marks and said second reference marks when images of said plurality of first reference marks are projected on said plurality of second reference marks through said plurality of projection optical systems; and a correction unit which is connected to said positional deviation detector, and which corrects imaging characteristics of said projection optical systems based on said positional deviations.

10. A projection exposure apparatus according to claim 9, wherein said plurality of first reference marks are in a shape of rectangle.

11. A projection exposure apparatus according to claim 9, wherein said second reference marks are in a shape of cross.

12. A projection exposure apparatus according to claim 9, wherein the projection exposure apparatus is a scanning-type projection exposure apparatus which effects scanning movement of the mask and the photosensitive substrate relative to the projection optical systems.

13. A projection exposure apparatus which exposes a pattern of a mask on a substrate, comprising:

a projection optical system which is disposed between said mask and said substrate, and which projects an image of said pattern on said substrate;

a mask table which has a first reference mark corresponding to said projection optical system, and which holds said mask;

a substrate table which has a second reference mark corresponding to said first reference mark, and which holds said substrate;

a positional deviation detector which moves said mask table in a direction substantially perpendicular to an optical axis of said projection optical system to detect a positional deviation between said first reference mark and said second reference mark; and a correction unit which is connected to said positional deviation detector, and which corrects an imaging characteristic of said projection optical system based on said positional deviation.

14. A projection exposure apparatus according to claim 13, further comprises:

a position detector which detects a position of said mask table.

15. A projection exposure apparatus according to claim 13, wherein said projection exposure apparatus comprises a plurality of said first reference marks.

16. A projection exposure apparatus according to claim 13, wherein said projection exposure apparatus comprises a plurality of said projection optical systems.

17. A projection exposure apparatus according to claim 13, wherein the projection exposure apparatus is a scanning-type projection exposure apparatus which effects scanning movement of the mask and the substrate relative to the projection optical system.

18. A projection exposure method of exposing a pattern of a mask on a substrate through a plurality of projection optical systems, comprising the steps of:

disposing, in correspondence to said plurality of projection optical systems, a plurality of sets of first reference marks provided on a mask table holding said mask;

disposing, in correspondence to said first reference marks, a plurality of sets of second reference marks provided on a substrate table holding said substrate;

detecting positional deviations between said first references marks and said second reference marks when said plurality of sets of first reference marks are projected on said plurality of sets of second reference marks through said plurality of projection optical systems; and correcting imaging characteristics of said projection optical systems based on said positional deviations.

19. A projection exposure method according to claim 18, wherein said first reference marks are disposed in at least twos, in correspondence to each of said plurality of projection optical systems.

20. A projection exposure method according to claim 18, wherein said second reference marks are disposed in at least twos, in correspondence to each of said plurality of projection optical systems.

21. A projection exposure method according to claim 18, wherein the projection exposure method is a scanning-type projection exposure method which effects scanning movement of the mask and the substrate relative to the projection optical systems.

22. A substrate on which said pattern has been exposed by the method according to claim 18.

23. A projection exposure method of exposing a pattern of a mask on a substrate through a projection optical system, comprising the steps of:

disposing, in correspondence to said projection optical system, at least one first reference mark provided on a mask table holding said mask;

disposing, in correspondence to said first reference mark, at least one second reference mark provided on a substrate table holding said substrate;

projecting said first reference mark through said projection optical system on said second reference mark, and moving said mask table in a direction substantially perpendicular to an optical axis of said projection optical system to detect a positional deviation between said first reference mark and said second reference mark; and correcting an imaging characteristic of said projection optical system based on said positional deviation.

24. A projection exposure method according to claim 23, wherein a plurality of said projection optical systems are disposed.

25. A projection exposure method according to claim 23, wherein said first reference mark is in a shape of rectangle.

26. A projection exposure method according to claim 23, wherein said second reference mark is in a shape of cross.

27. A projection exposure method according to claim 23, wherein the projection exposure method is a scanning-type projection exposure method which effects scanning movement of the mask and the substrate relative to the projection optical system.

28. A substrate on which said pattern has been exposed by the method according to claim 23.

29. A method for making a projection exposure apparatus which exposes a pattern of a mask onto a substrate, comprising:

providing a plurality of projection optical systems which are disposed between said mask and said substrate, and which project an image of said pattern of said mask onto said substrate;

providing a mask table which has a plurality of first reference marks corresponding to said plurality of projection optical systems, and which holds said mask;

providing a substrate table which has a plurality of second reference marks corresponding to said plurality of first reference marks, and which holds said substrate;

providing a positional deviation detector which detects position deviations between said first reference marks and said second reference marks when images of said plurality of first reference marks are projected on said plurality of second reference marks through said plurality of projection optical systems; and providing a correction unit which is connected to said positional deviation detector, and which corrects imaging characteristics of said projection optical systems based on said positional deviations.

30. A method according to claim 29, wherein the projection exposure apparatus is a scanning-type projection exposure apparatus which effects scanning movement of the mask and the substrate relative to the projection optical systems.

31. A substrate on which said pattern has been exposed by a projection exposure apparatus made by the method according to claim 29.

* * * * *